United States Patent [19]

Drumm et al.

[11] Patent Number: 5,029,102

[45] Date of Patent: Jul. 2, 1991

[54] LOGICAL SYNTHESIS

[75] Inventors: Anthony D. Drumm, Endwell; Charles P. Sweet, Endicott, both of N.Y.

[73] Assignee: International Business Machines, Corp., Armonk, N.Y.

[21] Appl. No.: 59,651

[22] Filed: Jun. 8, 1987

[51] Int. Cl.$^5$ ............................................. G06F 15/60
[52] U.S. Cl. .................................. 364/489; 364/488; 364/200
[58] Field of Search ............... 364/300, 488, 489, 490, 364/491

[56] References Cited

U.S. PATENT DOCUMENTS 4,703,435  10/1987  Darringer et al. ................... 364/488
4,803,636  2/1989   Nishiyama et al. .................. 364/491

FOREIGN PATENT DOCUMENTS 0168650  1/1986  European Pat. Off. ............ 364/489

OTHER PUBLICATIONS

"An Approach to VLSI Logic Design", by L. F. Saunders, European Conference on Electronic Design Automation (EDA 84), IEE 84, 26-30 Mar., 1984, pp. 33-34.
"A New Look at Logic Synthesis", Darringer et al., IEEE 17th D.A. Conference, 1980, pp. 543-549.
"Quality of Designs from an Automatic Logic Generator (Alert)", Friedman et al., IEEE 7th D.A. Conference, 1970, pp. 71-89.
"Methods Used in an Automatic Logic Design Generator (Alert)", Friedman et al., IEEE Trans. on Computers, vol. C-18, No. 7, Jul. 1969, pp. 593-614.
"Minimization of Boolean Functions", F. J. Hill et al., "Introduction to Switch Theory and Logical Design", 1973.
"Experiments in Logic Synthesis", Darringer et al., IEEE-ICCC, 1980.
"Lores-Logic Reorganization System", Nakamura et al., IEEE 15th D.A. Conference, 1978, pp. 250-260.

*Primary Examiner*—Parshotam S. Lall
*Assistant Examiner*—V. N. Trans
*Attorney, Agent, or Firm*—Elmer W. Galbi; Arthur J. Samodovitz

[57] ABSTRACT

The present invention provides a logic synthesis method and system which begins with a set of register transfer statements describing the desired logic. These statements are converted to expressions in prefix form. Next, logic reduction is performed on the individual expressions. The modified expressions are then converted to a set of logical function blocks, some of which may not be primitive blocks. Logical reduction is performed on the global set of any remaining primitives. The output of the above process is then used to synthesize the logic circuit. Included in the invention are novel techniques for performing logic reduction on the individual expressions.

24 Claims, 9 Drawing Sheets

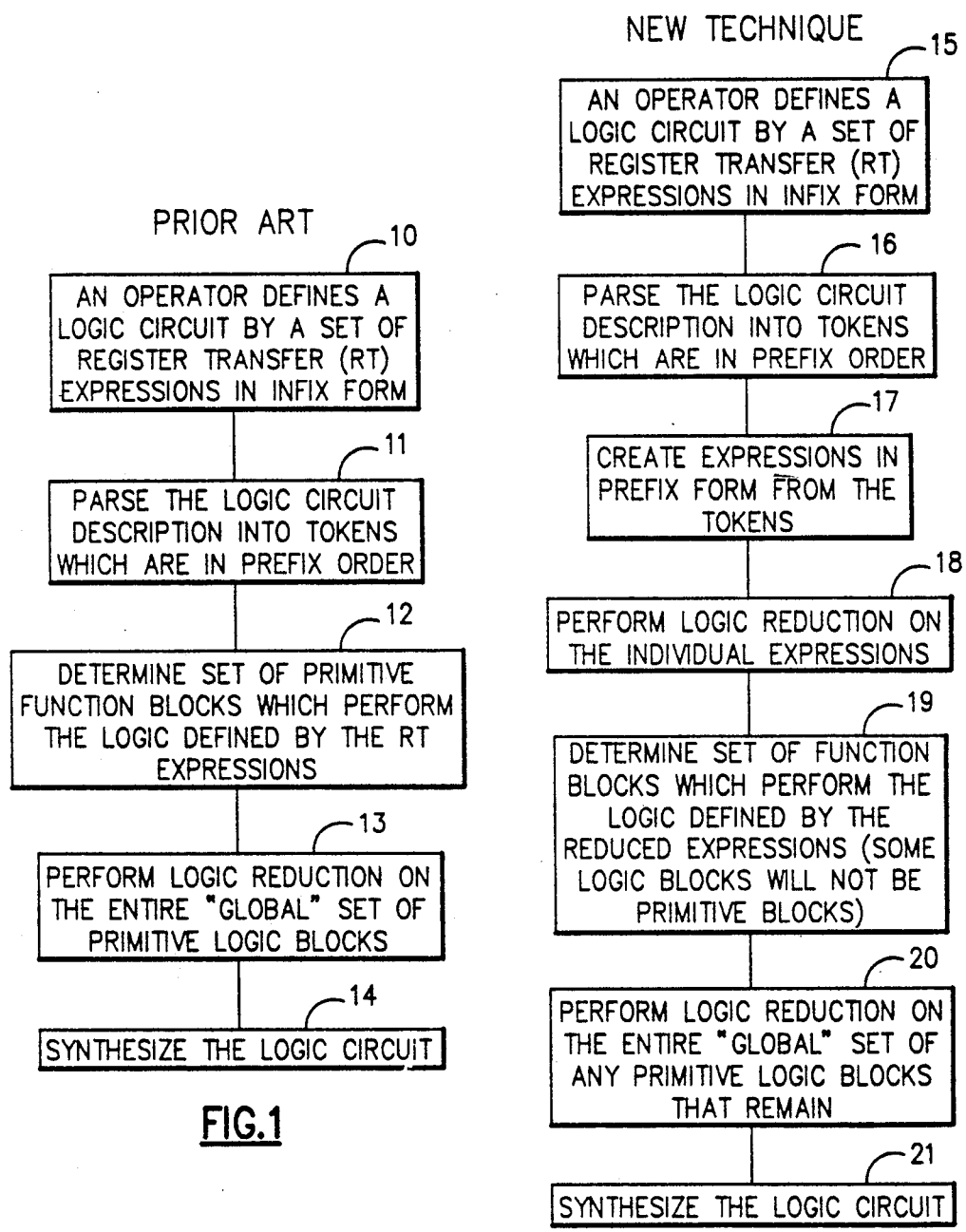

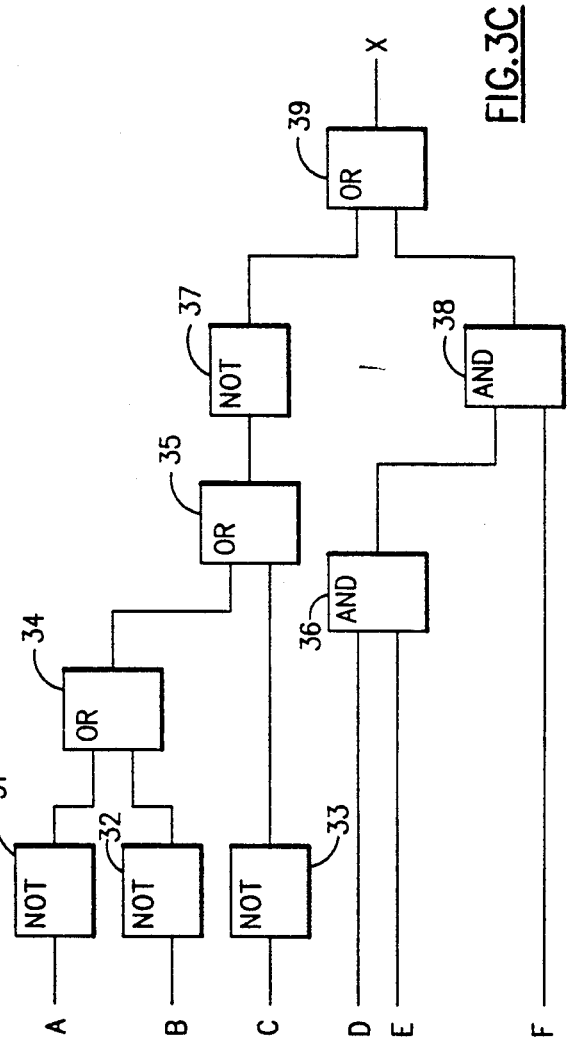

STEP 1: INVERTER REDUCTION (SUB-STEP A):
:( ~(OR( AI( A(0:63), B(0:63) ), ~( C(0:63) ) ) ),
&& && D(0:63), E(0:63) ), F(0:63) ) )

RESULTING LOGIC CIRCUIT REPRESENTATION:

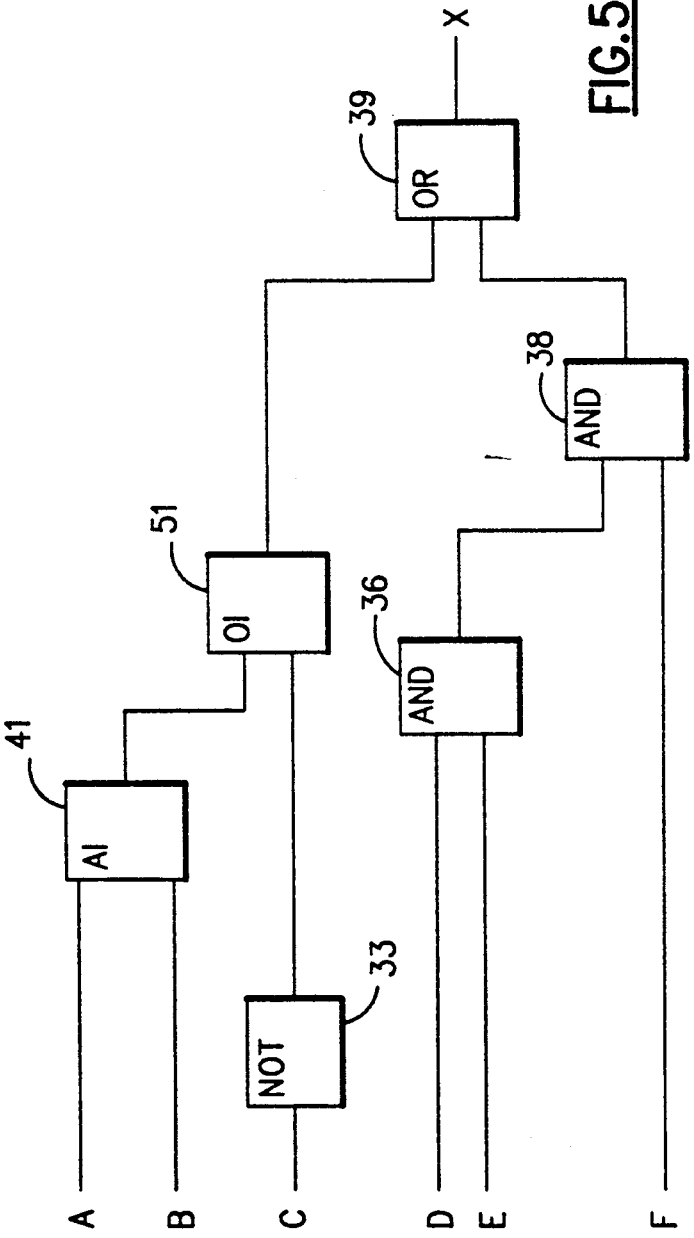

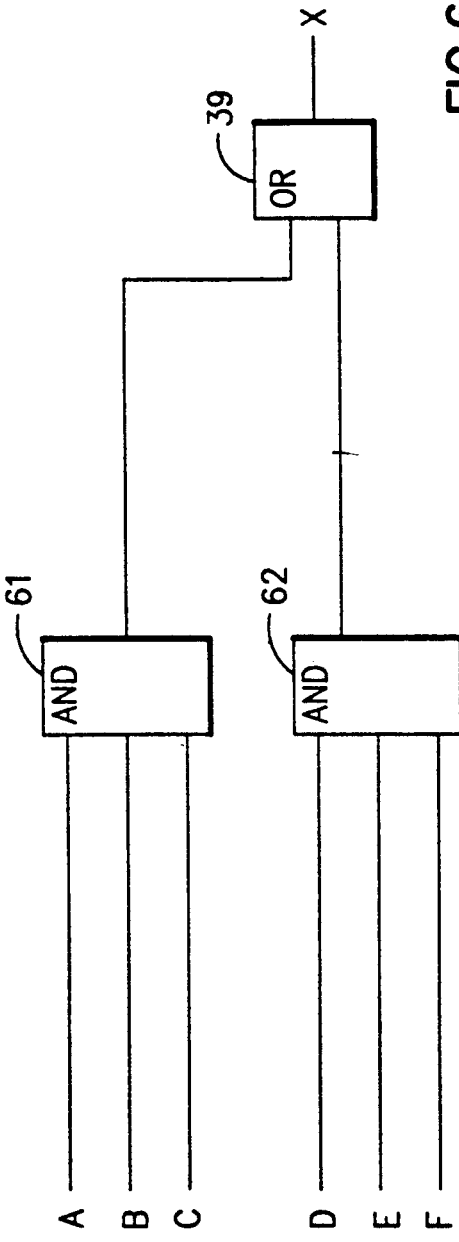

STEP 3: SIMPLE -> SIMPLE REDUCED TO GROUPED:
AO( ( A(0:63), B(0:63), C(0:63) ), ( D(0:63), E(0:63), F(0:63) ) )  } FIG. 7A

CORRESPONDING LOGIC CIRCUIT REPRESENTATION:

FIG.8A { STEP 4: GROUPED -> SIMPLE REDUCED TO GROUPED: NO CHANGE.
FIG.8B { STEP 5: SIMPLE -> GROUPED REDUCED TO GROUPED: NO CHANGE>
FINAL REDUCED EXPRESSION:
AO( ( A(0:63), B(0:63), C(0:63) ), ( D(0:63), E(0:63), F(0:63) ) )
FIG.8C
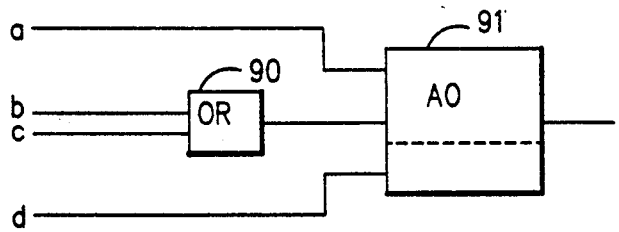
FIG.9A
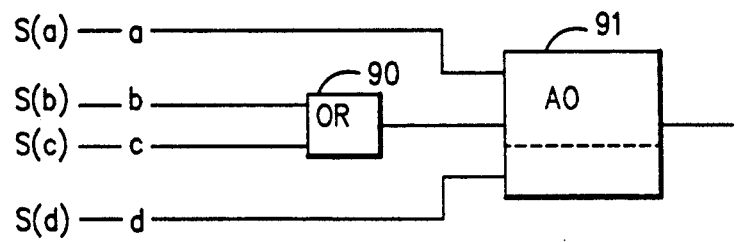
FIG.9B

LOGICAL SYNTHESIS

TECHNICAL FIELD

The present invention relates to design automation and more particularly to logic synthesis.

BACKGROUND AND PRIOR ART

Computer programs that perform logic synthesis are known. These computer programs generally use mathematical techniques that do not have general solutions. The classic example of the type of mathematical problem that does not have a general solution is the "traveling salesman" problem.

Faced with the lack of a rigorous mathematical solution, logic design engineers have had to develop techniques which may not be mathematically rigorous but which do produce acceptable results. Such techniques generally involve compromises and practical limitations.

The design of VLSI integrated circuits presents a number of challenges beyond those encountered in the design and development of smaller integrated circuit chips. A longer manufacturing cycle, tighter timing requirements, shorter machine cycle, and a larger number of gates per designer all must be overcome while a shorter development time is also desired. In order to produce a modern design, modern tools must be used.

One of the tools becoming increasingly common in logic design is synthesis. Logic synthesis addresses many problems, one of them being the conversion of a more-or-less technology independent register transfer (RT) design model to a technology dependent model. Many of the existing logic synthesis programs begin by having the designer describe the desired logical function in a high level "register transfer" language such as "Very High Speed Integrated Circuit (VHSIC) Hardware Description Language" (commonly referred to as VHDL). VHDL is a register transfer design language used by many government contractors.

Logic synthesis can also be used to generate a technology dependent model from a very high level (e.g. higher than RT) description or to convert a technology dependent design to a different technology. The former use is currently more theoretical than practical while the latter use is of limited value in certain situations due to the nature of certain designs. The term "logic synthesis" shall be used herein to mean the synthesis of a technology dependent model from an RT description.

The successful use of logic synthesis in the computer industry is becoming more and more common. Synthesis has been successfully used in the design of the a modern computer as described in a paper by Y. Tsuchiya, M. Morita, Y. Ikariya, E. Tsurumi, T. Mori, T. Yanagita,"Establishment of higher level logic design for very large scale computer," Twenty-third Design Automation Conference:, Las Vegas, Nev., 1986, pp. 366-371.

A paper by D. Gregory, K. Bartlett, A. de Geus, G. Hachtel, entitled "SOCRATES: A system for automatically synthesizing and optimizing combinational logic," Twenty-third Design Automation Conference, Las Vegas, Nev., 1986, pp. 79-85, has reported very good results in the use of their logic synthesis tool, For example in one experiment cited in this reference an ALU circuit TTL schematic was provided to an experienced designer and to the described system and both were given the task of optimizing the circuit for speed. The manual design overall performance was less than one percent better than the design from the automated system. However, the automated system generated its design in two CPU hours compared with six weeks for the manual design.

The existing logic synthesis programs generally operate as follows: They use a register transfer language description as input. This input is provided by a logic designer. The set of register transfer expressions written by the designer are parsed into tokens. Next these tokens are converted to a set of primitive boolean function blocks. Logic reduction transformations are then performed on this global set of primitive blocks.

One problem encountered while synthesizing a design is providing the same level of information to the logic synthesis system as would be available to a human designer. Much of the information available to a designer, however, does not exist in any computer-readable form. Yet, a Register Transfer (RT) description contains a great deal of information in the form of the logic structure which could be used by the logic synthesis tool.

Typically, as the RT description is processed in preparation for logic synthesis, the model is reduced to primitive form, thus destroying most of the structural information contained in the original description. This is done to place fewer restrictions on the logic reduction programs but experiments have shown that structural restrictions based on external broad-based knowledge (i.e. global information possessed by the designer and injected into the synthesis system via structure) produce better results. Compounding the problem of structural information loss, RT list languages often are degraded to a very primitive dyadic form making preservation of the structural information more difficult than for other description forms (graphics descriptions, for example).

With the present invention, innovations in the techniques for processing the output of a parser prior to and during the logic synthesis process have made it possible to preserve the designers original structure to a very large extent. One of the primary benefits this provides is that changes to the synthesized design may be effected in a predictable manner by modifying the original RT description.

There is a great deal of prior art relating to the problem of developing efficient logical synthesis programs. For example, there is an annual Design Automation Conference and the Proceedings of these conferences are regularly published. Twenty three such conferences have been held. The proceedings of the Twenty Third Conference where published in 1986. The proceedings of the annual Design Automation Conferences document the state of the art in this general area.

A book entitled *Design Automation of Digital Systems*, M. A. Breuer editor, Prentice Hall Inc.,(1972), and a book by F. J. Hall and G. R. Peterson, Digital Systems: Hardware Organization and Control, John Wiley & Sons Inc, New York 1973, provides an overview of the early developments.

A paper by J. R. Duley and D. L. Dietmeyer, "Translation of a DDL Digital System Specification to Boolean Equations," IEEE Transactions Computer C-18, 305-320 (1969) also provides background perspective about some of the early work.

A paper entitled "Logic Systhesis Through Local Transformations" by John Darringer, William Joyner, C. Derman and Louise Trevillyan, published in the IBM Journal of Research and Development Vol 25 No 4, page 272-280, July 1981 shows some examples of known logic reduction techniques.

A paper by D. Gregory, K. Bartlett, A. de Geus, and G. Hachtel, entitled "Socrates: A system for automatically synthesizing and optimizing combinational logic" Twenty Third Design Automation Conference" Las Vegas, Nev. 1986, pp. 79-85, describes an example of existing logic synthesis programs.

A paper by W. Joyner, L. Trevillyan, D. Brand, T. Nix and S. Gundersen, entitled "Technology adaptation in Logic Synthesis" Twenty third Design Automation Conference"Las Vegas, Nev., 1986, pp 94-100 shows an example of converting expressions to primitive prior to logic reduction.

OBJECTS OF THE INVENTION

The object of the present invention is to provide an improved logic synthesis technique.

A further object is to provide an improved logic reduction method.

A still further object is to provide a logic synthesis method that produced satisfactory results when synthesizing a wide class of logic circuits.

Yet another object was to provide a fast and efficient logic synthesis technique.

Another object is to provide a logic synthesis program that generally maintains the specified structure.

Another object is to make use of logic optimization programs to improve the results.

Still another object is to allow a technology independent Register Transfer description to be used.

SUMMARY OF THE INVENTION

The present invention provides a logic synthesis method and system which begins with a set of register transfer statements describing the desired logic. These statements are converted to expressions in prefix form. Next, logic reduction is performed on the individual expressions. The modified expressions are then converted to a set of logical function blocks, some of which may not be primitive blocks. Logical reduction is performed on the global set of any remaining primitives. The output of the above process is then used to synthesize the logic circuit.

Included in the invention are novel techniques for performing logic reduction on the individual expressions.

DESCRIPTION OF THE DRAWINGS

FIG. 1 shows a prior art synthesis technique.

FIG. 2 shows the overall steps in synthesing a circuit utilizing the present invention.

FIG. 3A is an example of a Register Transfer expression in infix form.

FIG. 3B is a prefix form of the expression in FIG. 3A.

FIG. 3C is a logical circuit representation of the expression in FIG. 3B.

FIG. 5A is an expression showing the second sub step in the reduction process.

FIG. 5B is a logical circuit representation of the expression in FIG. 5A.

FIG. 6A is an expression showing the second step in the reduction process.

FIG. 6B is a logical circuit representation of the expression in FIG. 6A.

FIG. 7A is an expression showing the third step in the reduction process.

FIG. 8A is an expression showing the fourth step in the reduction process

FIG. 8B is an expression showing the fifth step in the reduction process.

FIG. 8C shows the final reduced expression.

FIGS. 9A to 9G show an example of how function blocks are determined.

DETAILED DESCRIPTION

Figures 4A, 4B:
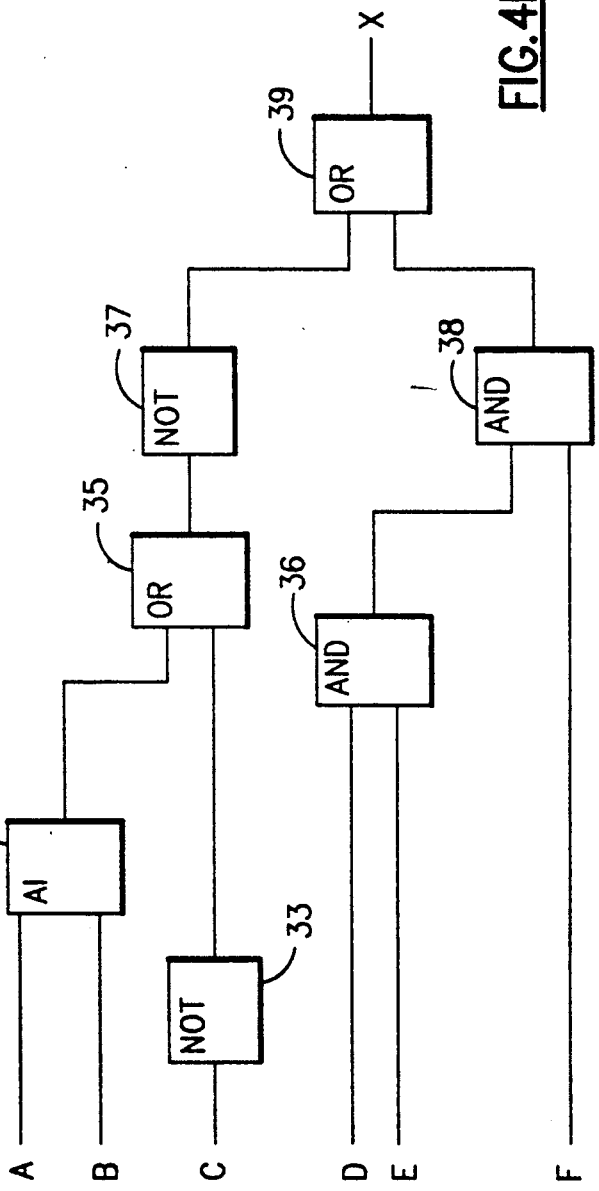
FIG. 4A is an expression showing the first sub step in the reduction process.
FIG. 4B is a logical circuit representation of the expression in FIG. 4A.

The overall operation of the present invention and how it compares to the prior art is best understood with reference to FIGS. 1 and 2.

The first two steps in the method of the present invention represented by blocks 15 and 16 in FIG. 2 are similar to the steps used in the prior art technique which are represented by blocks 10 and 11 in FIG. 1. In both techniques, the designer specifies the logic cirouit he wants to implement using a Register Transfer language. This is shown in FIG. 1 by block 10 and in FIG. 2 by block 15. A well known language called VHDL is an example of a Register Transfer language which uses an infix format. VHDL is a language frequently used in connection with work done for the U.S. Government.

A variety of Register Transfer languages, called RT languages, (such as for example VHDL) are described in the literature and since the details of the particular language used is not of significance to the present invention, the nature of the RT language will not be described herein.

In the second step of both the prior art and the present invention, the designers specification are parsed and translated from infix form to a prefix form. This is shown by block 11 in FIG. 1 and by block 16 in FIG. 2. Parsers for making a conversion between infix form and prefix form are well known and they will not be explained in detail herein.

In the prior art process, the next step represented by block 12 involves the generation of a set of primitive logic blocks which perform the specified logic. Next, as represented by block 13, logical reduction operations are performed on this entire "global" set of primitive logic blocks. There is no consideration of any information that the original designer had concerning natural arrangements of the logic blocks. It is virtually impossible for a designer to foresee how the reduction operation represented by block 13 will operate on the logic he designs. As a final step indicated by block 14, the logic circuit is synthesized.

In the technique of the present invention, as shown in FIG. 2, the same parsing of the infix expressions into tokens is performed as was done with the prior art technique. This is shown by block 16 in FIG. 2. However, with the present invention, in the next step of the process, represented by block 17, expressions are created from the tokens.

As will be explained in detail later, as represented by block 18, logic reduction is performed on the individual expressions.

Next, as represented by block 19, the reduced expressions are used to establish logic that will perform the required operations. It is important to note that some of the logic blocks will not be primitive logic blocks. That is some of the resulting logic blocks may involve relatively complex logical operations.

As shown by block 20, all of the remaining primitive logic blocks are reduced using the same type of reduction that was used in the prior art technique. The non primitive large blocks are not affected during this step.

In the final step, represented by block 21, the logic is synthesized in the same way that it was done in the prior art.

As will be explained in detail, the present invention manipulates expressions so that the resultant expressions represent logic with fewer blocks and levels of logic than the original expressions. The invention then produces a logic model from the resulting expressions. This logic model can then be used for a conventional synthesis operation.

PARTS OF THE INVENTION

The overall process shown in FIG. 2 and several parts thereof are inventive.

The logic reduction which is performed on the individual expressions (block 18 in FIG. 2) involves several novel and inventive aspects.

First, a series of reduction operations are performed. The order that these operations are performed is important to the operation of the present invention. The novel sequence in which these operations is performed is described below.

Second, one of the operations that is performed is "Inverter Reduction". A novel and inventive technique for performing inverter reduction is described below.

Third, another operation that is performed is collapsing two levels of logic into one level. This novel techniques is described below.

The manner of creating logic blocks from expressions (block 19 in FIG. 2) is also a novel and inventive aspect of this invention.

DEFINITIONS

In the following explanation the following terms have the following meaning:

Expression: An expression consists of an operator followed by operands. AO (( a O (b c )) d ) is an expression. Its operator is AO.

Operand Group: An operand group has several operands. The expression AO (( a O (b c )) d ) is equivalent to an AO block whose first group of inputs is a and the output of the O block (fed by b and c) and whose second group is the input fed by d. (a O(b c )) is an operand group. Note that the operands may themselves be expressions.

Simple Operand: An operand which is not an expression. a, b, c, and d above are simple operands.

Inner Expression: An operand which is an expression. O(b c) is an inner expression.

ARRANGEMENT OF FOLLOWING DESCRIPTIVE MATERIAL

The following detailed description of this embodiment of the invention is organized as follows:

1) A description of how expressions are created (block 17 in FIG. 2).
2) Description of how logic reduction is performed (block 18 in FIG. 2).
   A) Description of Sequence of Reduction routines.
   B) Description of Removal of Inverters.
   C) Description of other reduction Techniques.
3) Description of Determining Function blocks (block 19 in FIG. 2).
4) Detailed example.

CHANGING TOKENS TO EXPRESSIONS (BLOCK 17 IN FIG. 2)

As indicated by block 17, with the present invention, after the RT expression is parsed into tokens in the conventional manner, the tokens are changed into expressions.

The manner of changing a series of tokens which are in prefix form into expressions is well known and will not be explained in detail herein. An example is given below.

Given an RT expression as follows:

$$X = ( A \& B ) | (C \& D)$$

where

| represents an OR function

& represents an AND function

When this is parsed into tokens it appears as : | & A B & C D

The location of the parenthesis is implied in the above statement. The above can be changed into an expression by merely inserting the parenthesis as follows: | ( & ( A B ) & ( C D ))

The technique for doing the above is well known and forms no part of the present invention. It will therefore not be explained further.

Description of Sequencing the Reduction Routines

The sequencing of the expression manipulating algorithms is done in such a way that logic reduction is maximized and the number of processing steps is greatly reduced. It is important to note that the reduction algorithms are recursive.

The particular logic reduction routines used in the example given herein are:
1) Inverter Reduction.
2) Logic Level reduction.
   a) Simple block to simple block to produce a simple block
   b) Simple block to simple block to produce a grouped block
   c) Grouped block to simple block to produce a grouped block
   d) Simple block to grouped block to produce a grouped block There are two considerations inherent in the establishment of the sequence. The first is to determine the set of reductions and the order in which they are invoked. The second decision is whether to pass all the reductions as a unit through the recursive calls or to pass subsets of them (one subset at a time) through the recursive calls. If the reductions are not invoked in the proper manner the resultant expression will not be reduced as fully as possible.

The reason for this can be exemplified as follows. Assume that the invocation of the first reduction does not find any reduction in the expression. The second reduction would perform some reduction and create a new expression that could still be reduced further. However the only reduction that could find this reduction (on the new expression) is the first one (which had already operated on the expression in its original form). Consequently it would be necessary to run the series of reductions more than once until no changes in the expression occurred in order to fully reduce the expression.

The improved technique described below is a five step procedure that is required to be executed only once in order to perform all possible reduction within an expression. Each of the five steps is passed individually through the recursive calls.

The technique which has been found to produce improved results is as follows:

1) Remove inverters from the expression
2) Perform all reduction of simple blocks feeding simple blocks which compress to simple blocks
3) Perform all reduction of simple blocks feeding simple blocks which compress to grouped blocks
4) Perform all reduction of grouped blocks feeding simple blocks which compress to grouped blocks
5) Perform all reduction of simple blocks feeding grouped blocks which compress to grouped blocks

DESCRIPTION OF REDUCTION TECHNIQUE: REMOVAL OF INVERTERS

The various reduction techniques used to perform logic reduction on the expressions (block 18 in FIG. 2) will now be described. The novel inverter reduction technique will be explained first. This technique is a more efficient and information preserving technique than those known in the art.

Inverters may be reduced in several ways: Inverters feeding inverters may be removed. Inverters may be combined with more complex source functions to form complements of the functions (e.g. AND feeding an inverter may become a NAND). Inverters may be combined with more complex sink functions to form other complex functions (e.g. inverters feeding an AND may become a NOR).

Inverters may be moved around XOR or ADDER functions to reduce the total number of inverters. Inverters may be compressed into a source block if that block supports two-phase outputs.

The method begins with an expression in prefix form. Such an expression would include operators and operands. The method operates as follows:

A) Examine each of the expression's operands from left to right and recursively operate on any inner expressions,
   A1) if the expression's operator is an inverter and its operand is an operator then,
      A1a) if the inner expression operator is an inverter, replace the expression by the operand of the inner expression,
      A1b) otherwise, invert the expression's operator and replace its operand with the inner expression's operand,
   A2) if the expression's operator is not an inverter and all of its operands are inverter inner expressions, then perform a DeMorgan translation on the expression and replace its operands by the operands of the inverter inner expressions, whereby the resulting expression will represent a circuit which has been reduced if possible.

The following is a detailed example of a series of steps for performing the above operation. This example given herein assumes that only the following functions appear as operators in an expression: AND, OR, XOR, XORI, I, AO, OA, AI, OI, AOI, OAI For purposes of clarity and ease of reference the overall process is called ALGO.

1) point to the 1st operand.
2) if operand pointed to is a simple operand then go to 5.
3) pass the inner expression (operand pointed to) to ALGO
4) when ALGO returns the inner expression then if its operator is an inverter then go to 6
5) remember that at least one operand is not inverted
6) if the expression has more operands then point to the next operand and go to 2
7) if the operator of the expression is an inverter then go to 8 otherwise
   if all the expressions operands are inner expressions whose operators are inverters then go to 13 otherwise
   go to 15

NOTE—in order to reach step 8 the expression must be of the form I(X) where I represents the inverter function and X is an operand. An inverter expression has only one operand.

8) if X is not an inner expression then go to 15
9) when the inner expressions operator is A change I (the expressions operator) to AI

| | |
|---|---|
| O | OI |
| XOR | XORI |
| I | * (remove it) |
| AO | AOI |
| OA | OAI |
| AI | A |
| OI | O |
| XORI | XOR |
| AOI | AO |
| OAI | OA |

10) remove the inner expressions operator and outer most right and left parenthesis
11) if the expressions operator has been removed (is an *) then remove its outer most left and right parenthesis
12) go to 15

NOTE—in order to reach step 13 the expression must be of the form O(I(X) I(Y) . . . I(Z))

13) when the expressions operator is

| | |
|---|---|
| A change it to | OI |
| O | AI |
| XOR | XOR (if it has an even number of operands) |

XORI (if it has an odd number of operands)

| | |
|---|---|
| AO | OAI |
| OA | AOI |
| AI | O |
| OI | A |
| XORI | XORI (if it has an even number of operands) |

XOR (if it has an odd number of operands)

| | |
|---|---|
| AOI | OA |
| OAI | AO |

Figure 10A:
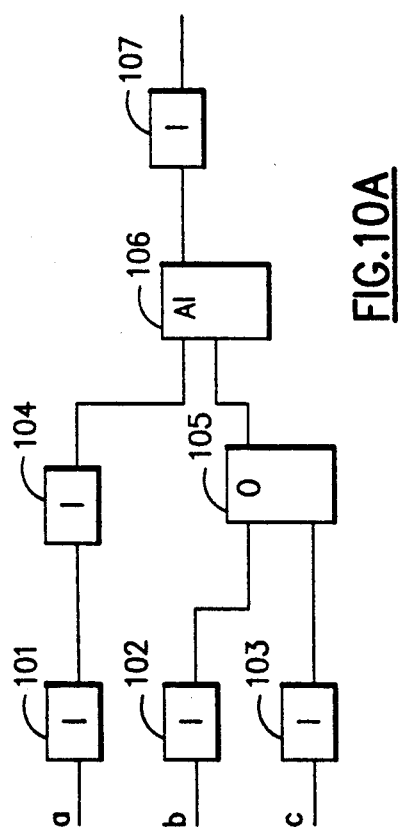
FIG. 10A shows a logic circuit with several inverters.

14) remove the operator and outermost right and left parenthesis from each of the expressions operands (inner expressions)
15) return the expression An example of the technique as applied to a specific logic circuit is given below. It uses the expression I(AI(I(I(a)) O(I(b) I(c)))) which represents the following logic. This is shown in FIG. 10A.

Figure 10B:
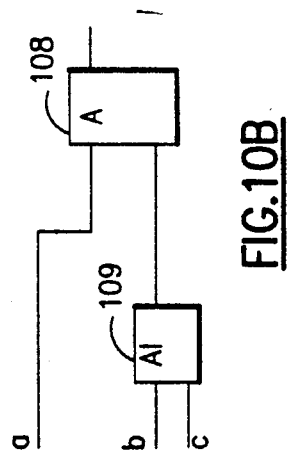
FIG. 10B shows a logic circuit without inverters which is equivalent to the logic circuit shown in FIG. 10A.

Equivalent logic with inverters removed is shown in FIG. 10B and is represented by the expression A(a AI(b c)).

For convenience of reference the series of steps is called ALGO.

At the beginning I(AI(I(I(a)) O(I(b) I(c)))) is passed to ALGO.

LEVEL 1 is processing the expression I(AI(I(I(a)) O(I(b) I(c))))
 1) AI(I(I(a)) O(I(b) I(c))) is the first operand for LEVEL 1
 2) AI(I(I(a)) O(I(b) I(c))) is an inner expression
 3) pass AI(I(I(a)) O(I(b) I(c))) to LEVEL 2

LEVEL 2 is processing the expression AI(I(I(a)) O(I(b) I(c)))
 1) I(I(a)) is the first operand for LEVEL 2
 2) I(I(a)) is an inner expression
 3) pass I(I(a)) to LEVEL 3

LEVEL 3 is processing the expression I(I(a))
 1) I(a) is the first operand for LEVEL 3
 2) I(a) is an inner expression
 3) pass I(a) to LEVEL 4

LEVEL 4 is processing the expression I(a)
 1) a is the first operand for LEVEL 4
 2) a is a simple operand
 5) a is not an inverter
 6) there are no more operands for LEVEL 4
 7) I is an inverter
 8) a is not an inner expression
 15) return I(a) to LEVEL 3

LEVEL 3 is processing the expression I(I(a))
 4) the operator of I(a) is an inverter
 6) there are no more operands for LEVEL 3
 7) the operator of I(I(a)) is an inverter
 8) I(a) is an inner expression
 9) the LEVEL 3 expression becomes *(I(a))
 10) the LEVEL 3 expression becomes *(**a*)
 11) the LEVEL 3 expression becomes **a which is equivalent to a
 15) return a to LEVEL 2

LEVEL 2 is processing the expression AI(a O(I(b) I(c)))
 4) a does not have an operator
 5) a is not an inverter
 6) O(I(b) I(c)) is the next operand for LEVEL 2
 2) O(I(b) I(c)) is an inner expression
 3) pass O(I(b) I(c)) to LEVEL 3

LEVEL 3 is processing the expression O(I(b) I(c))
 1) I(b) is the first operand for LEVEL 3
 2) I(b) is an inner expression
 3) pass I(b) to LEVEL 4

LEVEL 4 is processing the expression I(b)
 1) b is the first operand for LEVEL 4
 2) b is a simple operand
 5) b is not an inverter
 6) there are no more operands for LEVEL 4
 7) I is an inverter
 8) b is not an inner expression
 15) return I(b) to LEVEL 3

LEVEL 3 is processing the expression O(I(b) I(c))
 4) the operator of I(b) is an inverter
 6) I(c) is the next operand for LEVEL 3
 2) I(c) is an inner expression
 3) pass I(c) to LEVEL 4

LEVEL 4 is processing the expression I(c)
 1) c is the first operand for LEVEL 4
 2) c is a simple operand
 5) c is not an inverter
 6) there are no more operands for LEVEL 4
 7) I is an inverter
 8) c is not an inner expression
 15) return I(c) to LEVEL 3

LEVEL 3 is processing the expression O(I(b) I(c))
 4) the operator of I(c) is an inverter
 6) there are no more operands for LEVEL 3
 7) O is not an inverter but all LEVEL 3 operands are inverters
 13) LEVEL 3 expression becomes AI(I(b) I(c))
 14) the LEVEL 3 expression becomes AI(**b* **c*) which is equivalent to AI(b c)
 15) return AI(b c) to LEVEL 2

LEVEL 2 is processing the expression AI(a AI(b c))
 4) the operator of AI(b c) is not an inverter
 5) AI is not an inverter
 6) there are no more operands for LEVEL 2
 7) AI is not an inverter and not all the LEVEL 2 operands are inverters
 15) return AI(a AI(b c)) to LEVEL 1

LEVEL 1 is processing the expression I(AI(a AI(b c)))
 4) the operator of AI(a AI(b c)) is not an inverter
 5) AI is not an inverter
 6) there are no more operands for LEVEL 1
 7) the operator of the LEVEL 1 expression is an inverter
 8) AI(a AI(b c)) is an inner expression
 9) the LEVEL 1 expression becomes A(AI(a AI(b c)))
 10) the LEVEL 1 expression becomes A(**a AI(b c) *) which is equivalent to A(a AI(b c))
 11) the expressions operator was not removed
 15) return A(a AI(b c))

DESCRIPTION OF REDUCTION TECHNIQUES—LOGIC LEVEL REDUCTION

There are thirty two possible two level sets of logic that are reducible to a single block. (note, AI blocks feeding and OI block are equivalent to a single AND block and an AND block feeding an AND block is equivalent to a single AND block).

There are a variety of ways that these thirty two possibilities can be grouped. For example there can be thirty two groups each containing one reduction or there can be one group containing thirty two reductions.

The novel logic level reduction technique described below is designed to perform all the required reductions within a group. It should be noted that the mechanics of this process is independent of the partitioning of the thirty two possibilities. It should also be noted that the application of the process for a group may produce an expression that is not fully reduced. Complete reduction occurs after procession for all groups.

The method begins with an expression in prefix form. Such an expression might include operators and operands. The method operates as follows:

Examine each of the expression's operands from left to right and recursively operate on any expression:

If at least one operand is an inner expression with a compressible operator, and no operand is incompatible with this compression then, change the expression operator to the compressed operator and replace compressible inner expressions with their operands.

The example given below assumes only the following functions appear as operators in an expression AND, OR, AO, OA, AI, OI, AOI, OAI, I, XOR, XORI.

We first list the configurations for which it is possible to remove levels of logic and use the terminology X→Y=Z to mean that a logic block with function Y fed by blocks with function X is equivalent to one with function Z. This list is provided by TABLE I. The various possibilities are grouped under major headings because the algorithm to be presented is applied to a major heading and performs all possible reduction within the group. The reason for having four groups rather than on large group (which is also possible) is to achieve a significant reduction in processing time.

The following are examples of the reductions that are performed:

TABLE I

| SIMPLE - SIMPLE to SIMPLE | SIMPLE - SIMPLE to GROUPED |
|---|---|
| 1.1) A → A = A | 2.1) O → A = OA |
| OI → A = OI | AI → A = AOI |
| 1.2) O → OI = OI | 2.2) A → OI = AOI |
| AI → OI = A | OI → OI = OA |
| 1.3) O → O = O | 2.3) A → O = AO |
| AI → O = AI | OI → O = OAI |
| 1.4) A → AI = AI | 2.4) O → AI = OAI |
| OI → AI = O | AI → AI = AO |
| GROUPED - SIMPLE to GROUPED | SIMPLE - GROUPED to GROUPED |
| 3.1) OA → A = OA | 4.1) O → OA = OA |
| AOI → A = AOI | AI → OA = AOI |
| 3.2) AO → OI = AOI | 4.2) A → AOI = AOI |
| OAI → OI = OA | OI → AOI = OA |
| 3.3) AO → O = AO | 4.3) A → AO = AO |
| OAI → O = OAI | OI → AO = OAI |
| 3.4) OA → AI = OAI | 4.4) O → OAI = OAI |
| AOI → AI = AO | AI → OAI = AOI |

Prior to execution of the method several counts are set to 0 and several variables are initialized based on the group being processed and the function of the expressions operator.

COUNTS (initially set to 0)—
OPND—number of simple operands
I—number of inner expressions whose operator is I
OP—number of inner expressions whose operator is NOP

VARIABLES

In each of the four groups in TABLE I there are eight possibilities for compression. Within each of the eight are four sets of two possibilities. For the two possibilities the block being fed is the same and in one case the feeding block is inverted, and in the other it is not.

OP—the function of the non-inverted feeding block
IOP—the function of the inverted feeding block
NOP—the new function that results if OP is collapsed into the block it feeds
NIOP—the new function from collapsing IOP Thus the variables are initialized as follows.

TABLE II

| | OP | IOP | NOP | NIOP | | OP | IOP | NOP | NIOP |
|---|---|---|---|---|---|---|---|---|---|
| 1.1) | A | OI | A | OI | 3.1) | OA | AOI | OA | AOI |
| 1.2) | O | AI | OI | A | 3.2) | AO | OAI | AOI | OA |
| 1.3) | O | AI | O | AI | 3.3) | AO | OAI | AO | OAI |
| 1.4) | A | OI | AI | O | 3.4) | OA | AOI | OAI | AO |
| 2.1) | O | AI | OA | AOI | 4.1) | O | AI | OA | AOI |
| 2.2) | A | OI | AOI | OA | 4.2) | A | OI | AOI | OA |
| 2.3) | A | OI | AO | OAI | 4.3) | A | OI | AO | OAI |
| 2.4) | O | AI | OAI | AO | 4.4) | O | AI | OAI | AO |

LEV1OP—(either NOP or NIOP if compression is possible. This variable is set within the algorithm.)

Note that the counts and variables exist for each recursive call to a technique called ALGO2.

ALGO2 is structured as follows-Either steps 2 to 6 or 7 to 27 are performed. If the latter is the case then steps 7 to 12 examine the expressions operands (making recursive calls for inner expressions) and incrementing counts. Steps 13 to 16 determine if compression is possible and if so, what kind. Steps 17 to 27 manipulate the expression and inner expressions (without recursive calls) to complete the reduction.

ALGO2 consists of the following steps:

(1) if the expressions operator is A, O, AI, OI (for SIMPLE—SIMPLE to SIMPLE, SIMPLE—SIMPLE to GROUPED, GROUPED—SIMPLE to GROUPED) or AO, OA, AOI, OAI (for SIMPLE—GROUPED to GROUPED) then go to 7

2) point to first operand 3) if operand pointed to is a simple operand then go to 5

4) pass the inner expression (operand pointed to) to ALGO2

5) if the expression has more operands then point to the next one and go to 3

6) go to 28

7) set counts to 0 and initialize variables 8) point to first operand 9) if operand pointed to is a simple operand then increment #OPND by 1 and go to 12

10) pass the inner expression (operand pointed to) to ALGO2

11) WHEN algo2 returns the inner expression then if its operator is OP then increment #OP by 1
IOP then increment #IOP by 1
I (an inverter) then increment #I by 1

12) if the expression has more operands then point to the next operand and go to 4

13) if #OP=0 and #IOP =0 then go to 28 (compression is not possible)

14) if #IOP=0 then LEV1OP=OP and go to 17

15) if (IOP+#I) is less than or equal to #OP then LEV 1OP=OP and go to 17

16) if #OPND>0 then
if#OP=0 then go to 28 compression is not possible)
else LEV1OP=OP
else LEV1OP=OP 17) point to first operand 18) if operand pointed to is a simple operand then go to 26
19) if the inner expressions operator=LEV1OP then remove it and go to 23
20) if LEV1OP is not equal to IOP then go to 26
21) if the inner expressions operator is not an inverter then go to 25
22) remove the inner expressions operator
23) if the operand (inner expression) is a grouped operand or ALGO2 is not for SIMPLE—SIMPLE to GROUPED then remove the inner expressions left and right most parenthesis
24) go to 26
25) when the inner expressions operator is

| A then change it to | |
|---|---|
| A | AI |
| OA | OAI |
| AOI | AO |
| OI | O |
| O | OI |
| AO | AOI |
| OAI | OA |
| AI | O |
| XOR | XORI |
| XORI | XOR |

26) if the expression has more operands then point to the next operand and go to 18
27) if LEV1OP=IOP then change the expressions operator to NIOP else change the expresisons operator to NOP
28) return the expression An example of ALGO2 is now given. Consider the expression O(A(I(a) OI(b c)) I(d) OI(e f) AI(g h)):
Equivalent logic is represented by the expression OAI (a b c) d (e f) g h)

THE FOLLOWING IS A SPECIFIC EXAMPLE TO ALGO2

O(A(I(a) OI(b c)) I(d) OI(e f) AI(g h)) is passed to ALGO2: for SIMPLE—SIMPLE to SIMPLE
LEVEL1 is processing the expression O(A(I(a) OI(b c)) I(d) OI(e f) AI(g h))

1) the operator of the LEVEL1 expression is O
7) #OPND, #OP, #I, #IOP=0 the operator of the expression is O so using 1.3 from TABLE II

| OP | IOP | NOP | NIOP |
|---|---|---|---|
| O | AI | O | AI |

8) A(I(a) OI(b c)) is the first operand for LEVEL1
9) A(i(a) OI (b c)) is an inner expression
10) pass A(I(a) OI(b c)) to LEVEL2
LEVEL2 is processing the expression A(I(a) OI(b c))
1) the operator of the LEVEL2 expression is A
7) #OPND, #OP, #I, #IOP=0
using 1.1 from TABLE II

| OP | IOP | NOP | NIOP |
|---|---|---|---|
| A | OI | A | OI |

8) I(a) is the first operand for LEVEL2
9) I(a) is an inner expression
10) pass I(a) to LEVEL3

LEVEL3 is processing the expression I(a)
1) the operator of the LEVEL3 expression is I so go to 28
28) I(a) is returned to LEVEL2
LEVEL2 is processing the expression A(I(a) OI(b c))
11) #I=1
12) OI(b c) is the next operand for LEVEL2
9) OI(b c) is an inner expression
10) pass OI (b c) to LEVEL3
LEVEL3 is processing the expression OI(b c)
1) the operator of the LEVEL3 expression is OI
7) #OPND, #OP, #I, #IOP=0
using 1.2 from TABLE II

| OP | IOP | NOP | NIOP |
|---|---|---|---|
| O | AI | OI | A |

8) b is the first operand for LEVEL3
9) b is a simple operand-#OPND=1 (increment #OPND)
12) c is the next operand for LEVEL3
9) c is a simple operand-#OPND=2 (increment #OPND)
12) there are no more operands for LEVEL3
13) go to 28
28) return OI(b c) to LEVEL2
LEVEL2 is processing the expression A(I(a) OI(b c))
11) #IOP=1 (increment #IOP)
12) there are no more operands for ELVEL2
13) #IOP is greater than 0
14) #IOP is greater than 0
15) #IOP+#I is greater than #OP
16) #OPND=0 so LEV1OP =OI
17) I(a) is the first operand for LEVEL2
18) I(A) is an inner expression
19) I (the inner expressions operator) does not equal OI (LEV1OP)
20) LEV1OP=OI=IOP
21) the inner expressions operator is an inverter
22) the LEVEL2 expression becomes A(*(a) OI(b c))
23) the LEVEL2 expression becomes A(**a* OI(b c)) which is equivalent to A(a OI( b c))
LEVEL2 is processing the expression A(a OI(b c))
26) OI(b c) is the next operand for LEVEL2
18) OI(b c) is an inner expression
19) the inner expressions operator=OI=LEB1OP so the LEVEL2 expression becomes A(a *(b c))
23) the LEVEL2 expression becomes A(a **b c*) which is equivalent to A(a b c)
26) there are no more operands for LEVEL2
23) LEV1OP=OI=IOP so the LEVEL2 expression becomes OI(a b c)
28) OI(a b c) is returned to LEVEL1
LEVEL1 is processing the expression O(OI(a b c) I(d) OI(e f) AI(g h))
11) nothing gets incremented
12) I(d) is the next operand for LEVEL1
. . . I(d) is passed to LEVEL2 and is returned to LEVEL1 . . .
11) #I=1 (increment #i)
12) OI(e f) is the next operand for LEVEL1
. . . OI(e f) is passed to LEVEL2 and is returned to LEVEL1 . . .
11) nothing gets incremented
12) AI(g h) is the next operand for LEVEL1

... AI(g h) is passed to LEVEL2 and is returned to LEVEL1 ...
11) #IOP = 1 (increment #IOP)
12) AI(g h) is the last operand for LEVEL1
13) #IOP = 1
14) #IOP = 1
15) #IOP + #I is greater than #OP
16) #OPND = 0 so LEV1OP = IOP = AI
17) OI(a b c) is the first operand for LEVEL1
18) OI(a b c) is an inner expression
19) OI (the inner expressions operator) does not equal AI (LEV1OP)
20) LEV1OP = AI = IOP
21) OI (the inner expressions operator) is not an inverter
25) the LEVEL1 expression becomes O(O(a b c) I(d) OI(e f) AI(g h))

LEVEL1 is processing the expression O(O(a b c) I(d) OI(e f) AI(g h))
26) I(d) is the next operand for LEVEL1
18) I(d) is an inner expression
19) I (the inner expressions operator) does not equal AI (LEV1OP)
20) LEV1OP = AI = IOP
21) the inner expressions operator is an inverter
22) the LEVEL1 expression becomes O(O(a b c) *(d) OI(e f) AI(g h))
23) the LEVEL1 expression becomes O(O(a b c) **d* OI(e f) AI(g h)) which is equivalent to O(O(a b c) d (OI(e f) AI(g h))

LEVEL1 is processing the expression O(O(a b c) d OI(e f) AI(g h))
26) OI(e f) is the next operand for LEVEL1
18) OI(e f) is an inner expression
19) OI (the inner expressions operator) does not equal AI (LEV1OP)
20) LEV1OP = AI = IOP
21) OI (the inner expressions operator) is not an inverter
25) the LEVEL1 expression becomes O(O(a b c) d O(e f) AI(g h))

LEVEL1 is processing the expression O(O(a b c) d O(e f) AI(g h))
26) AI(g h) is the next operand for LEVEL1
18) AI(g h) is an inner expression
19) AI (the inner expressions operator) = LEV1OP so the LEVEL1 expression becomes O(O(a b c) d O(e f) *(g h))
23) the LEVEL1 expression becomes O(O(a b c) d O(e f) **g h*) which is equivalent to O(O(a b c) d O(e f) g h)

LEVEL1 is processing the expression O(O(a b c) d O(e f) g h)
26) there are no more operands for LEVEL1
27) LEV1OP = AI = IOP so the LEVEL1 expression becomes AI(O(a b c) d O(e f) g h)
28) ALGO2 returns AI(O(a b c) d O(e f) g h)

We have seen that passing O(A(I(a) OI(b c)) I(d) OI(e f) AI(g h)) to ALGO2 for SIMPLE—SIMPLE to SIMPLE produces AI(O(a b c) d O(e f) g h). If the latter expression is passed to ALGO2 for SIMPLE—SIMPLE to GROUPED the result is OAI((a b c) d (e f) g h) and the desired reduction has been accomplished.

DESCRIPTION OF DETERMINING FUNCTION BLOCKS (BLOCK 19 IN FIG. 2)

The following paragraphs describe a recursive technique that examines an expression and creates the corresponding logic model in a form suitable for logic synthesis.

The technique described here traverses an expression and creates the logic. As described each is followed by an example which uses the expression AO((a O(b c)) d).

The technique described here is recursive. It is passed an expression and passes inner expressions and simple operands to itself. It will be shown that these expressions (which are in prefix form) are ideally suited for recursive manipulation.

The process begins with an expression having been passed to it. It replaces the expression with a logic block representation of the expression. The input pins, the output pins and logic block interconnections are explicitly defined. The method operates as follows:

It examines each of the expression's operands from left to right and recursively operates on any inner expressions.

If the operand is the first for the expression, it creates a logic block whose function is the same as the expressions operator and it adds an output pin to the block.

For all operands, an input pin is added to the block and connected to the operands source.

When all operands have been processed, the output pin is returned as a source.

It should be noted that for bussed logic, the configuration described is created for each bit in the buss.

NOTE: the Expressions passed to this routine are either of the form:
I) O(X ... X) where O is an operator and each X is either
  1) a simple operand or
  2) (Y ... Y) where each Y is either a simple operand or an inner expression. This is called an operand group. or
  3) an inner expression or
II) a simple operand.

As described here the method is called ALGO3.

If a simple operand is passed to ALGO3 its SOURCE is returned

If an expression is passed to ALGO3 we have—
1) point to the 1st operand.
2) if operand pointed to is a simple operand then perform steps 3 to 5.
if operand pointed to is an operand group then for each operand (whether it is a simple operand or an expression) in the operand group perform steps 6 and 7. Then go to 11.
if the operand pointed to is an inner expression then perform steps 8 to 10.
3) pass the simple operand to the ALGO3
4) when the ALGO3 returns the SOURCE
  A) if the simple operand is the expression's first operand then
    i) create a logic block and use the expressions operator as its function
    ii) add an output pin to the block
  B) add an input pin to the block and connect it to the SOURCE
5) go to 11
6) pass the (operand group's) operand to the ALGO3
7) when the ALGO3 returns the SOURCE
  A) if the operand group is the expression's first operand and if this operand (in the operand group) is the first operand in the operand group then
    i) create a logic block and use the expressions operator as its function ii) add an output pin to the block
B) add an input pin to the block and connect it to the SOURCE
8) pass the inner expression operand to the ALGO3
9) when the ALGO3 returns the SOURCE
   A) if the inner expression is the expression's first operand then
      i) create a logic block and use the expressions operator as its function
      ii) add an output pin to the block
   B) add an input pin to the block and connect it to the SOURCE
10) go to 11
11) if the expression has more operands then point to the next operand and go to 2
12) return the output pin (of the block created for the expression) as the SOURCE

EXAMPLE

This example illustrates how the logic below is constructed from the expression AO(a O(bc)) d). S(a) . . . S(d) is interpreted as SOURCE of a . . . SOURCE of d. See FIG. 9B.

Figure 9F:
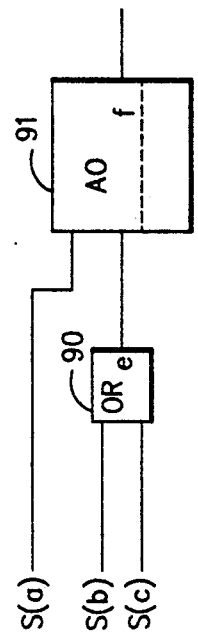
Figure 9G:
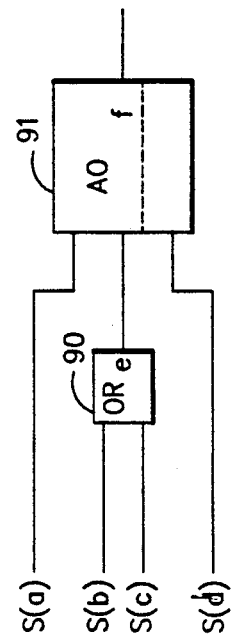
Figure 9C:
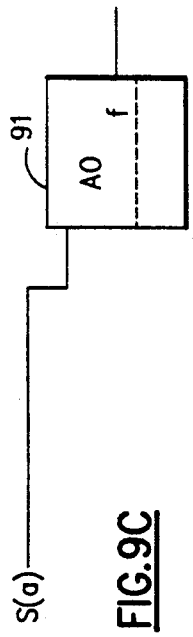
Figure 9D:
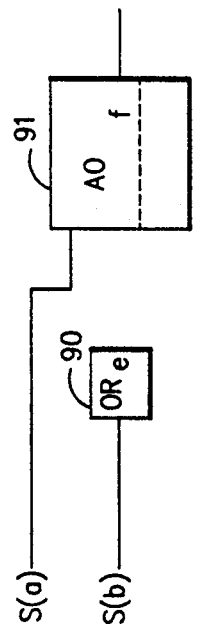
Figure 9E:
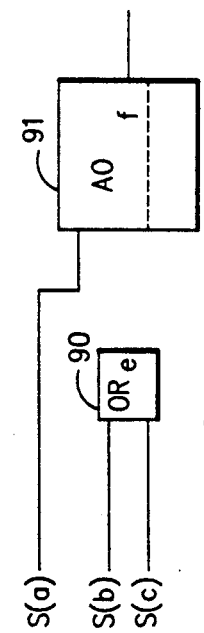

AO((a O(b c)) d) is passed to ALGO3.
LEVEL 1 is processing the expression AO((a O(b c)) d)
1) (a O(b c)) is the first operand for LEVEL 1
2) (a O(b c)) is an operand group
LEVEL 1 is processing operand a in operand group (a O(b c))
6) pass a to LEVEL 2 and LEVEL 2 returns S(a)
7) (a O(b c)) is the LEVEL 1 expression's first operand and a is the first operand in (a O(b c)) so
   A) create an AO block with output pin f
   B) add an input pin and connect it to S(a)
   i.e. see FIG. 9C for a logic description.
LEVEL 1 is processing operand O(b c) in operand group (a O(b c))
6) O(b c) is passed to LEVEL 2
LEVEL 2 processing the expression O(b c)
1) b is the first operand for LEVEL 2
2) b is a simple operand
3) pass b to LEVEL 3 and LEVEL 3 returns S(b)
4) b is the LEVEL 2 expression's first operand so
   A) create an O block with output pin e
   B) add an input pin and connect it to S(b)
   This is shown in FIG. 9D
5) go to 11
11) c is the next operand for LEVEL 2
2) c is a simple operand
3) pass c to LEVEL 3 and LEVEL 3 returns S(c)
4) c is not the LEVEL 2 expression's first operand so
   B) add an input pin and connect it to S(c)
   This is illustrated in FIG. 9E
5) go to 11
11) there are no more operands for LEVEL 2
12) e is returned to LEVEL1 as the SOURCE
LEVEL 1 is processing operand O(b c) in operand group (a O(b c))
7) (a O(b c)) is the first operand for LEVEL 1 but O(b c) is not the first operand for (a O(b c)) so
   B) add an input pin and connect it to e
   This is illustrated in FIG. 9F.
There are no more operands for (a O(b c)) so go to 11)
11) d is the next operand for LEVEL 1
2) d is a simple operand
3) pass d to LEVEL 2 and LEVEL 2 returns S(d)
4) d is not the LEVEL 1 expression's first operand so
   B) add an input pin and connect it to S(d)
   This is illustrated in FIG. 9G.
5) go to 11
11) there are no more operands for LEVEL 1
12) LEVEL 1 returns f as the SOURCE

EXAMPLE OF HOW TECHNIQUE OPERATES (FIGS. 3A TO 8C)

In order to illustrate the operation of the present invention, a very simple example is shown in FIGS. 3A to 8C. It should be understood that this simple example is merely given for the purposes of illustration and the invention is not limited to this specific example.

FIG. 3A shows a circuit specified by an expression in Infix form.

As shown in FIG. 3A the following is an example of a logical circuit specificized in "infix form"

$$X(0:63) = ((\overline{A(0:63)})|(\overline{B(0:63)})|(\overline{C(0:63)})|(\overline{D(0:63)}\&E(0:63)\&F(0:63)))$$

The same logical circuit can be specified in "prefix form" as shown in FIG. 3B and as follows:

$$|(\overline{\phantom{|}}(|(|(\overline{\phantom{|}}(A(0:63)),\overline{\phantom{|}}(B(0:63))),\overline{\phantom{|}}(C(0:63)))),\&(\&(D(0:63),E(0:63)),F(0:63)))$$

The conversion from infix form to prefix form is illustrated by block 16 in FIG. 2.

FIG. 3C is a representation of the prefix form in logic circuit format. The circuit includes NOT circuits 31, 32, 33, 37: OR circuits 34, 35 and 39: and AND circuits 36 and 38. FIGS. 4A and 5A show the expression after the inverter reduction technique of the present invention has been applied. FIGS. 4B and 5B show the expressions in 4A and 4B in logic circuit form. As shown in FIG. 4B several NOT circuits are removed and AN-DINVERT circuit 41 is added. As shown by FIG. 5, in the second sub-step several additional NOT circuits are replaced by ORINVERT circuit 51.

FIG. 6A shows the effect on the expression of a simple block being reduced to a simple block. FIG. 6A shows the expression and FIG. 6B shows the corresponding logic circuit. Several simple to simple blocks are replaced by AND circuits 61 and 62.

Figure 7B:
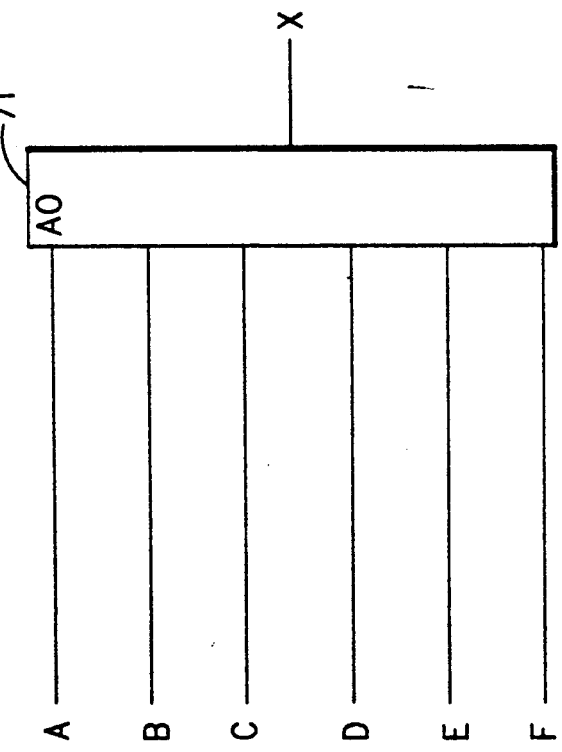
FIG. 7B is a logical circuit representation of the expression in FIG. 7A.

Finally as shown by the expression in FIG. 7A and the logic circuit in FIG. 7B, the logic is replaced by one AND-OR circuit 71. FIGS. 8A, 8B and 8C indicate that due to the simplicity of the example chosen, no further reduction is possible during those steps.

ADDITIONAL INFORMATION

Technology Independent RT Description: Few operations in this logic synthesis processing require information specific to the technology in use. The primary advantage, is to ease the transition from one technology to another. Certainly, changing among similar technologies (e.g. CMOS to CMOS) is relatively painless. Converting between dissimilar technologies requires somewhat more extensive process modification although it is still a very manageable task.

Technology changes are more likely to have an impact on the RT descriptions themselves, especially in design portions in which the designer has used a large number of technology blocks directly.

Reduce Design Concept to Implementation Time

A primary goal of this invention is to reduce the time required from the conception of the design to its implementation while assuring design correctness. This allows an engineering approach to logic design—one in which several alternatives may be tried, the results compared, and the best alternative selected—to be used.

Designers may concentrate more fully on the logical and physical characteristics of a design rather than on the tedious and error-prone tasks of detailed design entry and maintenance of the detailed design. The objective, therefore, is to allow complete verification of the correctness of the design prior to releasing any part to manufacturing.

The following operations are not explained in detail herein since they do not constitute a specific part of this invention beyond what has already been described: however, the following can be done to enhance the operation of the invention.

AND compression: AND functions which feed other AND functions may be combined forming a single, larger AND function. This operation tends to compress multiple levels of logic to a minimum form, and makes redundancy removal somewhat simpler.

Parallel reduction: Logic blocks which have identical input sources and identical functions can be combined into a single block. This has the effect of reducing common signals and may result in fewer cells.

Generation/propagation of constants: Conditions which degrade to a constant can be removed and replaced by the appropriate constant block (a tie-up or a tie-down block). Constants which feed normal logic blocks may generally either be removed or cause replacement of the block by a constant. For example, a one feeding an AND may be removed while a zero feeding an AND will cause the AND to be replaced by a zero.

AND factoring: When a set of common signals feed several AND blocks, these signals may be ANDed together and the resultant signal may replace the entire set at all the original sink blocks. This operation reduces the load on the factored terms (with the secondary effect of decreasing the number of cells necessary for fan-out repowering) and lowers the fan-in of the ANDs from which these terms were factored.

AND-OR generation: The model can be scanned for configurations which may be replaced by an AND-OR block. While the majority of AND-OR blocks in a design will have existed after expression processing, AND-OR generation will still locate AND-OR configurations in the random logic with a net effect of reducing the cells and connections in the design. AND-OR generation operates on a technology independent model but it uses technology AND-OR rule information.

The following are some examples of the types of changes which may be made in practicing the invention: One or more of the technology independent logic reduction routines may be removed from the scenario. For instance, by removing AND compression, similar logic will not be collapsed and will remain more nearly like what was originally specified in the RT description.

The redundancy removal operation may be removed to avoid the compression of redundant signals. One or more of the timing correction programs may be removed. Certain parameters to some programs may be changed to alter the scope of the programs effect.

While the invention has been described in its preferred embodiments, it is to be understood that the words which have been used are words of description rather than limitation and that changes may be made without departing from the true scope and spirit of the invention in its broader aspects. The scope of the invention is only defined by the following claims.

I claim:

1. A method of logic synthesis comprising the steps of:
   providing a set of register transfer statements describing the desired logic,
   converting said set of statements to a corresponding set of individual expressions, each of said expressions comprising a character string of at least one operator and one associated operand, and one of said expressions comprising a character string of a plurality of operators and a plurality of associated operands,
   performing logic reduction on said expressions individually, said logic reduction including at least one type of logic level reduction,
   converting each reduced expression individually to a corresponding set of logical function blocks including primitive and grouped blocks, and
   performing logic reduction on said primitive blocks globally, whereby primitive blocks corresponding to different expressions are reduced together, and
   wherein both converting steps and both logic reduction steps are performed by a computer.

2. The method recited in claim 1 wherein said logical reduction on said expressions is performed by:
   removing inverters from said expression,
   performing all reduction of simple blocks feeding simple blocks
   which compress to simple blocks,
   performing all reduction of simple blocks feeding simple blocks which compress to grouped blocks,
   performing all reduction of grouped blocks feeding simple blocks which compress to grouped blocks,
   performing all reduction of simple blocks feeding grouped blocks which compress to grouped blocks.

3. The method recited in claim 1 wherein said process is performed recursively.

4. A method as set forth in claim 1 further comprising the computerized step of modeling a logic circuit based on the logical function blocks after the step of logical reduction on said primitive blocks.

5. A method as set forth in claim 1 wherein said individual expressions are in prefix form.

6. A method of performing logical reduction on a set of logical blocks, said method comprising the steps of:
   performing reduction of simple blocks feeding simple blocks which compress to simple blocks,
   after said compression to simple blocks, performing reduction of simple blocks feeding simple blocks which compress to grouped blocks,
   after said compression to grouped blocks, performing reduction of grouped blocks feeding simple blocks which compress to grouped blocks, and
   after said reduction of grouped blocks, performing reduction of simple blocks feeding grouped blocks which compress to grouped blocks, and
   wherein all of said reduction steps are performed by a computer.

7. The method recited in claim 6 wherein said inverters are removed by:

a computerized method of inverter circuit reduction, each circuit being described by an expression including operands and operators in prefix notation, the operators including inverters, said method including the steps of:

recursively operating on any inner expression such that the operands are processed left to right during said recursive operation, one of the expression's operators being an inverter and its operand being an operator, and if the inner expression's operator is an inverter replacing the expression by the operand of the inner expression, otherwise, inverting the expression's operator and replacing its operand with the inner expression's operand, if another one of the expression's operator is not an inverter and all of tis operands are inverter inner expressions, then performing a De Morgan translation on the expression and replacing its operands by the operands of the inverter inner expressions, whereby the resulting expression will represent a circuit which has been reduced if possible.

8. A method as set forth in claim 6 further comprising the subsequent computerized step of modeling a logic circuit based in part on the simple and grouped blocks resulting after said reduction steps.

9. A method as set forth in claim 6 wherein all of said steps are performed on an expression, said expression comprising a character string of a plurality of operators and a plurality of associated operands.

10. A method as set forth in claim 9 further comprising the step of removing inverters from said expression before performing reduction of simple blocks feeding simple blocks.

11. A method of reducing inverters in a logical circuit, said logical circuit being described by an expression including operands and operators in prefix notation, the operators including inverters, said method being implemented by a computer and including the steps of:

recursively operating on any inner expression such that the operands are processed left to right during said recursive operation, one of the expression's operators being an inverter, and its operand being an operator, and if the inner expression's operator is an inverter, replacing the expression by the operand of the inner expression, otherwise, inverting the expression's operator and replacing its operand with the inner expression's operand, if another one of the expression's operators is not an inverter and all of its operands are inverter inner expressions, then performing a De Morgan translation on the expression and replacing its operands by the operands of the inverter inner expressions, whereby the resulting expression will represent a circuit which has been reduced if possible.

12. The method recited in claim 11 wherein said process is performed recursively.

13. A method as set forth in claim 11 further comprising the subsequent computerized step of modeling a logic circuit based in part on the inverter reduced expression.

14. A logic level reduction process to perform all the required reductions within a group of logic, said process being independent of the partitioning of the possibilities, and complete reduction occurring after procession for all groups, said process beginning with an expression including a plurality of operators and a plurality of associated operands in prefix form, being implemented by a computer, and comprising the steps of:

recursively operating on any expression, each of said expressions including a plurality of operands which are processed left to right during said recursive operation, at least one operand being an inner expression with a compressible operator, and no operand being incompatible with this compression, and further comprising the steps of:

changing the expression operator to the compressed operator and replacing compressible inner expressions with their operands, and wherein said expression is initially reduced such that simple logic elements feeding simple logic elements are reduced to simple logic elements, and subsequently reduced such that simple logic elements feeding simple logic elements are reduced to grouped logic elements.

15. The method recited in claim 14 wherein said process is performed recursively.

16. A method as set forth in claim 14 further comprising the subsequent computerized step of modeling a logic circuit based in part on the reduced expression.

17. The process of creating logic block representation from an expression representing said logic, said logic block representation of the expression including definitions of the input pins, the output pins and logic block interconnections, said process being implemented by a computer and including the following steps:

recursively operating on any inner expressions, each of said expressions including a plurality of operands which are processed left to right during said recursive operation, and for a first operand in the expression, creating a logic block whose function is the same as the expression's operator and adding an output pin to the block, adding an input pin to the block and connecting to the operand's source for all operands, and returning the output pin of each operator block as a source to the adjacent block corresponding to the leftward-operator, if any, when all operands have been processed.

18. The method recited in claim 17 wherein said process is performed recursively.

19. A method of reducing a logic circuit representation, said logic circuit being represented by a set of register transfer statements describing the desired logic, said method comprising the steps of:

converting each of said statements to an individual expression, each of said expressions comprising a character string of at least one operator and one associated operand, and one of said expressions comprising a character string of a plurality of operators and a plurally of associated operands, performing logic reduction on each expression individually to substantially reduce Inverter, And or Nand, and Or or Nor operators within each expression, said logic reduction including at least one type of logic level reduction, converting each reduced expression individually to a set of logical function blocks, and globally performing logical reduction on said sets of logical function blocks, whereby logical function blocks of different sets are used in the same reduction, and wherein all of said converting and reduction steps are performed by a computer.

20. The method recited in claim 13 wherein the logical reduction of said expressions produces non primitive blocks.

21. A method as set forth in claim 19 further comprising the subsequent computerized step of modeling a logic circuit corresponding to the globally reduced logical function blocks.

22. A method as set forth in claim 19 wherein each of individual expressions is in prefix form.

23. A single pass method of performing logical reduction on a set of logical blocks represented by an expression, said method comprising the following steps in order:

removing inverters from said expression, performing all reduction of simple blocks feeding simple blocks which compress to simple blocks, performing all reduction of simple blocks feeding simple blocks which compress to grouped blocks, performing all reduction of grouped blocks feeding simple blocks which compress to grouped blocks, performing all reduction of simple blocks feeding grouped blocks which compress to grouped blocks, whereby all reductions are completed in one pass, and wherein all of said reduction steps are performed by a computer.

24. The method recited in claim 23 where said expressions are in prefix form.

* * * * *